United States Patent [19]

Hu et al.

[11] Patent Number: 5,250,898
[45] Date of Patent: Oct. 5, 1993

[54] METHOD AND MEANS FOR MAGNETIC RESONANCE IMAGING AND SPECTROSCOPY USING PULSED SATURATION TRANSFER CONTRAST

[75] Inventors: Bob S. Hu; Steven M. Conolly, both of Menlo Park, Calif.

[73] Assignee: Board of Trustees of the Leland Stanford Junior University, Stanford, Calif.

[21] Appl. No.: 743,055

[22] Filed: Aug. 9, 1991

[51] Int. Cl.$^5$ ............................................. G01R 33/20
[52] U.S. Cl. ...................................... 324/309; 324/307
[58] Field of Search ............... 324/307, 309, 301, 300, 324/308, 311, 314

[56] References Cited

U.S. PATENT DOCUMENTS

| | | | |
|---|---|---|---|
| 3,953,789 | 11/1974 | Veeman et al. | 324/322 |
| 4,168,462 | 9/1979 | Ernst | 324/309 |
| 4,345,207 | 8/1982 | Bertrand et al. | 324/314 |
| 4,922,203 | 5/1990 | Sillerud et al. | 324/309 |
| 4,987,369 | 1/1991 | Van Stapele et al. | 324/307 |
| 5,025,216 | 6/1991 | Pauly et al. | 324/309 |
| 5,150,053 | 9/1992 | Pauly et al. | 324/309 |

OTHER PUBLICATIONS

N. Bloembergen, et al., "Cross-Relaxation in Spin Systems*," *Physical Review*, vol. 114, No. 2, Apr. 15, 1959.
P. S. Pershan "Cross Relaxation in LiF*," *Physical Review*, vol. 117, No. 1, Jan. 1, 1960.
Sture Forsen, et al., "Study of Moderately Rapid Chemical Exchange Reactions by Means of Nuclear Magnetic Double Resonance" *The Journal of Chemical Physics*, vol. 39, No. 11, Dec. 1963.
Fred M. Lurie, et al., "Spin Temperature in Nuclear Double Resonance*," *Physical Review*, vol. 133, No. 4A, Feb. 1964.
Hommo T. Edzes, et al., "The Measurement of Cross-Relaxation Effects in the Proton NMR Spin-Lattice Relaxation of Water in Biological Systems: Hydrated Collagen and Muscle*," *Journal of Magnetic Resonance*, 31, 207-229 (1978).
Seymour H. Koenig, et al., "Magnetic Cross-Relaxation among Protons in Protein Solutions†," *Solvent-Protein Cross-Relaxation*, pp. 4348-4358, vol. 17, No. 20, 1978.
B. M. Fung "Nuclear Magnetic Resonance Study of Water Interactions with Proteins, Biomolecules, Membranes, and Tissues," *Methods in Enzymology*, vol. 127, pp. 151-161. ©1986 Acad. Press.

(List continued on next page.)

*Primary Examiner*—Michael J. Tokar
*Assistant Examiner*—Raymond Y. Mah
*Attorney, Agent, or Firm*—Townsend and Townsend Khourie and Crew

[57] ABSTRACT

Disclosed is a method of detecting NMR signals indicative of a short $T_2$ species in the presence of a long $T_2$ species by utilizing magnetization transfer between species without requiring an auxiliary RF amplifier and with reduced power deposition (SAR). One or more zero degree RF pulses are applied to a body containing the short $T_2$ species and the long $T_2$ species with the pulses being at the resonant frequency. The RF pulses provides selective magnetization saturation of the short $T_2$ species, and the RF pulses are spaced in time to allow magnetization transfer from the short $T_2$ species to the long $T_2$ species. Gradients can then be applied to the body for signal localization with signals detected from the long $T_2$ species due to magnetization transfer from the short $T_2$ species being indicative of the presence of the short $T_2$ species. The signals are indicative also of the magnetization transfer between species. The zero degree RF pulses can be zero area binomial pulses or zero degree adiabatic pulses. Each pulse has a magnitude and a duration sufficient for significant magnetization decay in the short $T_2$ species.

13 Claims, 9 Drawing Sheets

OTHER PUBLICATIONS

Steven D. Wolff, et al., "Magnetization Transfer Contrast (MTC) and Tissue Water Proton Relaxation in Vivo," *Mag. Resonance in Medicine,* 10, 135-144 (1989).

Jianhui Zhong, et al., "Relative Contributions of Chemical Exchange and Other Relaxation Mechanisms in Protein Solutions and Tissues," *Magnetic Resonance in Medicine,* 11, 295-308 1989.

Jonathan Grad "Nuclear Magnetic Cross-Relaxation Spectroscopy," *Journal of Magnetic Resonance,* 89-000-000 pp. 1-7 (1990).

W. Thomas Dixon "Incidental Magnetization Tansfer Contrast In Standard Multislice Imaging," *Magnetic Resonance Imaging,* vol. 8, pp. 417-422, 1990.

John Eng "Quantitative $^1H$ Magnetization Transfer Imaging in Vivo," *Magnetic Resonance in Medicine,* 17, 304-314 (1991).

Bob S. Hu†, et al. "Pulsed Saturation Transfer Contrast," (submitted for publication not published as of Aug. 9, 1991.).

METHOD AND MEANS FOR MAGNETIC RESONANCE IMAGING AND SPECTROSCOPY USING PULSED SATURATION TRANSFER CONTRAST

The U.S. Government has rights in this invention pursuant to National Institute of Health grants HL-34962, HL39478, and HL 39297.

BACKGROUND OF THE INVENTION

This invention relates generally to magnetic resonance imaging, and more particularly the invention relates to imaging of short $T_2$ species by using magnetization transfer from the short $T_2$ species to a long $T_2$ species.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

A descriptive series of papers on NMR appeared in the June 1980 issue of the IEEE Transactions on Nuclear Science, Vol. NS-27, pp. 1220-1255. The basic concepts are described in the lead article, "Introduction to the Principles of NMR," by W.V. House, pp. 1220-1226, which employ computed tomography reconstruction concepts for reconstructing cross-sectional images A number of two-and three-dimensional imaging methods are described. Medical applications of NMR are discussed by Pykett in "NMR Imaging in Medicine," Scientific American, May 1982, pp. 78-88, and by Mansfield and Morris, NMR Imaging in Biomedicine, Academic Press, 1982.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_0$, of the precession of the nuclei is the product of the magnetic field $B_0$, and the so-called magnetogyric ratio, $\gamma$, a fundamental physical constant for each nuclear species:

$$\omega_0 = B_0 \cdot \gamma$$

Accordingly, by superimposing a linear gradient field, $B_z = z \cdot G_z$, on the static uniform field, $B_0$, which defined Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

The imaging of species having short spin-spin ($T_2$) relaxation times can be difficult or impossible using direct detection of free induction decay (FID) signals from the species. However, a technique using magnetization transfer from a short $T_2$ species to a long $T_2$ species has been used to indirectly image the short $T_2$ species.

These magnetization transfers or exchanges appear to be present in a large number of tissues and are thought to be related to the establishment of an exchangeable separate spin environment by macromolecules. The early work performed in spectrometers on hydrated protein samples as well as ex vivo samples of biological tissues established the exchange of magnetization between pools of relatively mobile long $T_2$ species and more restricted short $T_2$ species. Further more this phenomenon is shown to affect the macroscopically measured bulk relaxation times. A number of the essential elements of the magnetization transfer phenomenon have been described including the possible exchange mechanisms, rate of exchange, macroscopic relaxation times as well as estimates of the amount of exchangeable protons in various tissues.

S. Wolff and R. Balaban, "Magnetic Resonance in Medicine, 10(1), 135-144, (1989), first produced in vivo images with magnetization transfer weighted contrast (MTC). They also coined the terms free ($H_f$) and restricted ($H_r$) proton pools to describe the exchange compartments. Their technique took advantage of the broad lineshape of the short $T_2$ species by performing continuous irradiation several kHz off resonance to achieve selective saturation. Sufficient saturation of the short $T_2$ species, normally unobservable, is then indirectly observed via exchange with and subsequent partial saturation of the longer $T_2$ species. However, continuous off resonance irradiation leads to the practical problems of high power deposition (SAR) and the need for auxiliary RF amplifiers on conventional whole body imagers. W. Dixon, et al., "Magnetic Resonance Imaging," 8(4), 417-422, (1990), has demonstrated the presence of magnetization transfer in conventional whole body imagers by the application of multiple off resonance pulses, however, the effects obtained were small.

SUMMARY OF THE INVENTION

An object of the invention is an improved method of imaging short $T_2$ species using magnetization transfer from the short $T_2$ species to a long in $T_2$ species.

Another object of the invention is an apparatus for pulsed saturation transfer imaging without requiring auxiliary RF amplifiers or high power deposition.

Briefly, the magnetization transfer in accordance with the invention includes applying one or more zero degree RF pulses at a resonant frequency to a body having short $T_2$ species and long $T_2$ species in the presence of a static magnetic field ($B_0$). The RF pulses provide selective magnetization of the short $T_2$ species and no net magnetization to the long $T_2$ species. Magnetization is then transferred from the short $T_2$ species to the long $T_2$ species, and a standard imaging sequence can then be utilized to detect resulting magnetic resonance signals from the long $T_2$ species, the detected signals providing a measure of the short $T_2$ species and also a measure of the magnetization transfer.

The zero degree RF pulses can be zero area pulses or net zero degree adiabatic pulses. The selective saturation pulses must be of sufficient amplitude and duration to allow for $T_2$ decay of the short $T_2$ species yet be of a minimal duration to avoid decay of the long $T_2$ species. Further, the pulse must have sufficient bandwidth to prevent off resonance effects due to chemical shift and static field ($B_0$) inhomogeneities.

The invention and objects and features thereof will be more fully apparent from the following detailed description and appended claims when taken with the drawing.

DETAILED DESCRIPTION OF ILLUSTRATIVE EMBODIMENTS

Figure 1A:
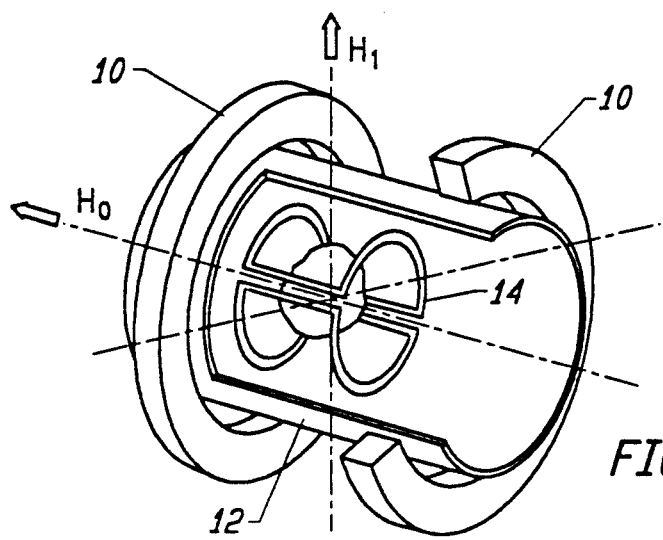
FIGS. 1A-1D illustrate the arrangement of MRI apparatus in magnetic field generated therein.
Figure 1B:
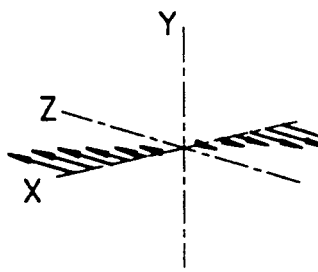
Figure 1C:
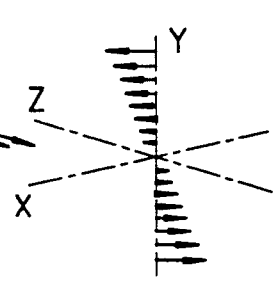
Figure 1D:
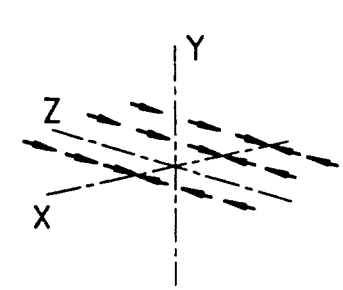

Referring now to the drawing, FIG. 1A is a perspective view partially in section illustrating coil apparatus in NMR imaging system, and FIGS. 1B-1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983, pp. 338-350. Briefly, the uniform static field $B_0$ is generated by the magnet comprising the coil pair 10. A gradient field $G(x)$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

Figure 2:
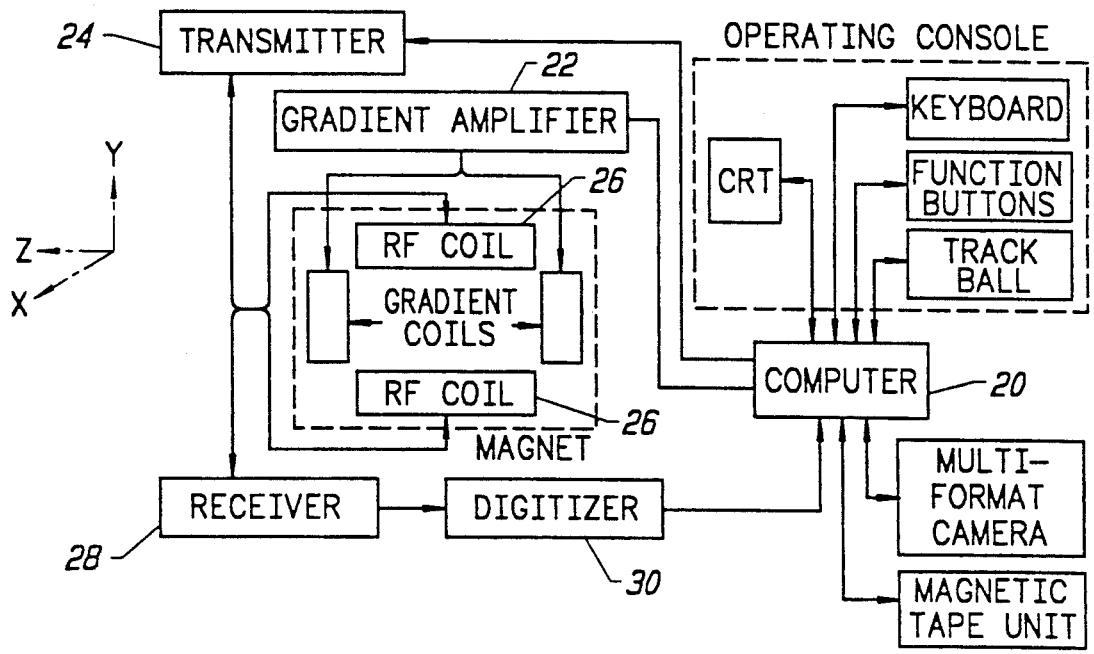
FIG. 2 is a functional block diagram of MR imaging apparatus.

FIG. 2 is a functional block diagram of the imaging apparatus as disclosed in NMR—A Perspective on Imaging, General Electric Company, 1982. A computer 20 is programmed to control the operation of the NMR apparatus and process FID signals detected therefrom. The gradient field is energized by a gradient amplifier 22, and the Rf coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
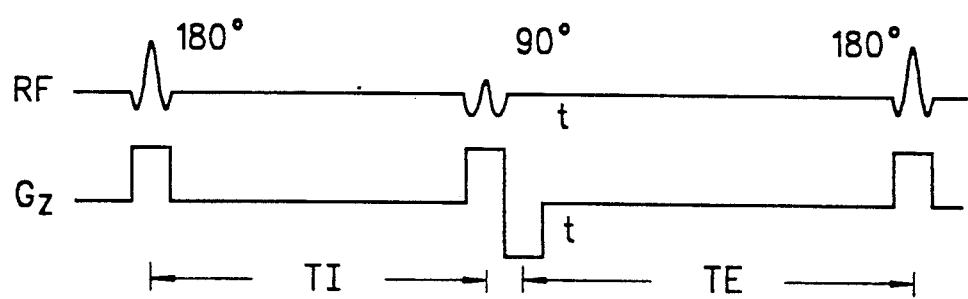
FIG. 3 illustrates a basic pulse sequence for exciting a slab for projection image.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween.

As described above, shorter $T_2$ species cannot be imaged directly using direct detection of free induction decay (FID) signals from the species. However, a technique using magnetization transfer from the short $T_2$ species to a long $T_2$ species has been used to indirectly image short $T_2$ species. The present invention is directed to an improved method and apparatus of detecting NMR signals indicative of the short $T_2$ in the presence of a long $T_2$ species by means of magnetization transfer between species. The invention employs one or more zero degree RF pulses applied to a body at a resonance frequency for the two species, the RF pulse being spaced in time to allow magnetization transfer from the short $T_2$ species to the long $T_2$ species. The invention does not require the use of auxiliary RF amplifiers on conventional whole body imagers, and the problems of high power deposition (SAR) are obviated.

The demonstration of normally unobservable proton pools in exchange with the observable pools is an important finding which increases the potential image contrast parameters available in NMR imaging without loss of SNR. An understanding of the behavior of these short $T_2$ spin pools in the presence of RF irradiation and the exchange kinetics between the pools can lead to specific pulse designs to enhance image contrast based on this process. The approach first reported by S. Wolff and R. Balaban, utilized off resonance irradiation to saturate the broad linewidth of the restricted proton species. While the approach is useful, an additional RF amplifier is required. Furthermore, a SAR penalty is paid despite the relatively broad resonance line of the short $T_2$ species.

We examined the rheoretical behavior of short $T_2$ species in the presence of RF irradiation with regards to pulse duration, amplitude and total integrated RF power, as well as off resonance effects. The need for a minimal RF amplitude to adequately saturate the restricted proton pools may explain the absence of significant MTC contrast in conventional imaging sequences and explain the small magnetization transfer effect noted by Dixon.

Based on the analysis, a single short intense RF pulse was designed to selectively saturate the restricted proton pools leaving the longer $T_2$ species relatively untouched, while operating within the RF limits of a clinical image. While an individual pulse carries considerable power, the on resonance nature of the zero degree pulse leads to overall saving in SAR.

Given the necessary assumption that cross relaxation occurs more rapidly than usual $T_1$ decay, the amount of decay after a single selective saturation pulse is shown to be an indirect measure of the relative pool size of the exchange species. Experimentally, the short $T_2$ fraction is muscle appears to be 1/10 to 1/20 the size of the longer $T_2$ fraction. This saturation recovery experiment is a variant of the inversion recovery method first described by Samuelski and Edzes and corroborates their relative pool size measurements in chicken muscle. Similar numbers have also been obtained by others.

Large intensity differences can be amongst tissues with multiple application of the pulse as demonstrated. Image contrast in the human head and extremities are consistent with those produced by others in animal models using small bore units. Preliminary data also suggest the possibility of using MTC related tissue suppression for isolating blood signal for angiography. While $T_2$ related decay of $H_f$ seen in off resonance irradiation technique is also present, this effect leads to less than 5% loss of the signal in the current sequence as determined experimentally in doped phantoms.

Although the three term binomial pulse used in this study is adequate in demonstrating the effects of MTC, off resonance behavior can presumably be further improved with higher order pulses which is easily implemented or with more specifically designed transparent pulses.

The major advantage of the pulse technique as described is the possibility of exploiting magnetization transfer contrast for research and possibly clinical work in conventional clinical imagers without the need for an auxiliary amplifier. Furthermore, the ability to estimate the restricted pool sizes in some tissues can complement the off resonance irradiation method in further elucidating the mechanics of the cross relaxation phenomenon.

Following is an analysis of the possible imaging options available on conventional magnetic resonance imaging units to enhance and exploit the magnetization transfer effects. Starting from the Bloch equations, we show that conventional pulses produce effects on the bound proton pools which borders on the large and small signal domains of Rabi. The differing behaviors of the observable versus the short $T_2$ proton pools during a constant RF pulse lead to the design of pulses which allow the production of magnetization transfer weighted images with lower power deposition compared with off resonance irradiation. Production of in vivo images using this technique is demonstrated.

Modifying the Bloch equations to include the effects of spin coupling between two systems of spins is generally accomplished by the addition of two spin exchange terms. While the exact mechanism of exchange can be due to a large number of factors, the same phenomenological equations for longitudinal magnetization can be used to describe the observed macroscopic process.

Because the reported exchange time constants are at least an order of magnitude longer than a typical RF pulse in whole body imagers, the exchange processes do not appreciably affect the system response during such excitations. Neglecting the exchange process, $T_1$ recovery and off resonance effects, the solutions for the Bloch equations in the presence of a constant continuous RF field are the classic rotating frame equations. Assuming the initial condition that $M_{xy}=0$, the $M_z$ magnetization can be put in the following form:

$$M_z(t) = M_z(0)\exp(-\alpha t)\left[\cosh(\beta t) + \frac{\alpha}{\beta}\sinh(\beta t)\right], \quad [1]$$

where $$\alpha = \frac{1}{2T_2} \text{ and } \beta = \alpha\sqrt{1 - 4\omega_1^2 T_2^2}. \quad [2]$$

It is clear that at low irradiating field strengths the solutions are purely real and lead to exponential decays. As the B field strength increases the real roots approach each other, eventually leading to a complex conjugate pair which consists of a real component of $\frac{1}{2}T_2$ and an imaginary component which depends approximately linearly on $\omega_1$. We normally work at the latter limits (the Rabi large signal domain) because conventional MRI units typically operates with peak $\omega_1 T_2 \gg \frac{1}{2}$. The extremely short $T_2$ (<200 us) of the restricted proton pool, however guarantees pure decay in the presence of typical peak $\omega_1/2\pi$ strengths of less than 1 KHz equivalent in clinical imagers. Thus, given a pulse of proper amplitude and duration, the net effect for observable protons of relatively long $T_2$ is an angle rotation while the bound proton with its short $T_2$ is largely decay. Given this analysis a properly designed zero degree or transparent pulse can lead to selective saturation of the restricted proton pool while leaving the free proton pool relatively undisturbed.

Once the initial condition of selective saturation of $H_r$ is achieved, the exchange behavior of the longitudinal magnetization can be observed. In the absence of an irradiation field the modified Bloch equation can be reduced to the following pair of first order equations:

$$\begin{bmatrix} \dot{M}_{zf} \\ \dot{M}_{zr} \end{bmatrix} = \begin{pmatrix} -\frac{1}{\tau_f} - \frac{1}{T_{1f}} & \frac{1}{\tau_r} \\ \frac{1}{\tau_f} & -\frac{1}{\tau_r} - \frac{1}{T_{1r}} \end{pmatrix}\begin{bmatrix} M_{zf} \\ M_{zr} \end{bmatrix} + \begin{bmatrix} \frac{M_{0f}}{T_{1f}} \\ \frac{M_{0r}}{T_{1r}} \end{bmatrix} \quad [3]$$

$T_{1f}$ and $T_{1r}$ are the longitudinal relaxation times expected without exchange. $\tau_f$ and $\tau_r$ are the cross relaxation times. Subscripts of r and f refer to $H_r$ and $H_f$ proton pools respectively. Again the characteristic time constants are a combination of the various $T_1$'s and exchange constants of the system as follows $$\text{Roots} = -\frac{1}{2}\left(\frac{1}{T_{1f}} + \frac{1}{T_{1r}} + \frac{1}{\tau_f} + \frac{1}{\tau_r}\right)\left\{1 \pm \sqrt{1 - 4\frac{\left[\left(\frac{1}{T_{1f}} + \frac{1}{\tau_f}\right)\left(\frac{1}{T_{1r}} + \frac{1}{\tau_r}\right) - \frac{1}{\tau_f \tau_r}\right]}{\left(\frac{1}{T_{1f}} + \frac{1}{T_{1r}} + \frac{1}{\tau_f} + \frac{1}{\tau_r}\right)}}\right\} \quad [4]$$

In fact, the exchange process is only observable if the exchange time constants are significantly shorter than the $T_1$ time constants. This leads to additional simplifications. Given the initial condition of $M_{zr}=0$, a monoexponentially decaying $M_{zf}$ can be derived:

$$M_{zf}(t) \approx M_{zf}(0) + \qquad [5]$$

$$M_{zf}(0) \frac{\tau_r}{\tau_f + \tau_r} \left\{ \exp\left[1\left(\frac{1}{\tau_f} + \frac{1}{\tau_r}\right)t\right] - 1 \right\}.$$

The steady state relationships given the initial selective saturation conditions can then be expressed as follow:

$$M_{zr}(\infty) = M_{zf}(\infty)\left(\frac{\tau_r}{\tau_f}\right) \text{ or } M_{zr}(\infty) = M_{zf}(0) - M_{zf}(\infty). \qquad [6]$$

These solutions suggest that knowledge of $M_{f0}$ and $M_{fs}$ gives an estimate of the size of the free and restricted proton pools and the $\tau_f$ to $\tau_r$ ratio. Furthermore, the rate of exchange can then be used to estimate the absolute value of the exchange constants. This general analysis of exchange spectra was first reported by Bloembergen et al., in connection with their explanation of the experimental results of cross saturation effects in paramagnetic salts.

The large amplitude of the pulses required can lead to significant power deposition issues. While it is known that a given steady magnetization in a continuous wave experiment is maintained by the power of the irradiation, and integrated power advantage can be shown in approaching a given desired magnetization by optimizing the irradiation amplitude. Analytically, Eq. 1 and 2 can be rewritten in a form which emphasizes the role of the total energy deposition:

$$M_z(\tau) = M_z(0)\exp(-\alpha\tau)\left[\cosh(\beta\tau) + \frac{\alpha}{\beta}\sin(\beta\tau)\right], \qquad [7]$$

where $$\alpha = \frac{1}{2T_2} \text{ and } \beta = \alpha\sqrt{1 - 4\frac{E}{\tau}T_2^2}. \qquad [8]$$

E represents the energy of the pulse. $\tau$ is the duration of the pulse. At the point of critical damping, $4E/\tau T_2^2 = 1$, the residual longitudinal magnetization can be rewritten as $$M_s = M_s(O)\exp[-2ET_2](1 + 2ET_2). \qquad [9]$$

Similarly, at a given E if $4E/\tau T_2^2 << 1$ the square root term can be expanded. The longitudinal magnetization can then be written as $$M_z = M_z(O)\exp[-ET_2]. \qquad [10]$$

For any given E, the ratio of the residual magnetizations is then $$\exp[-ET_2](1 + 2ET_2). \qquad [11]$$

This function is near unity for small decays but decreases significantly for desired decays of greater than 60%. Thus, in the desired limit of near saturation, a saving in the integrated power is achieved if the RF amplitude is optimized on resonance.

Figure 4A:
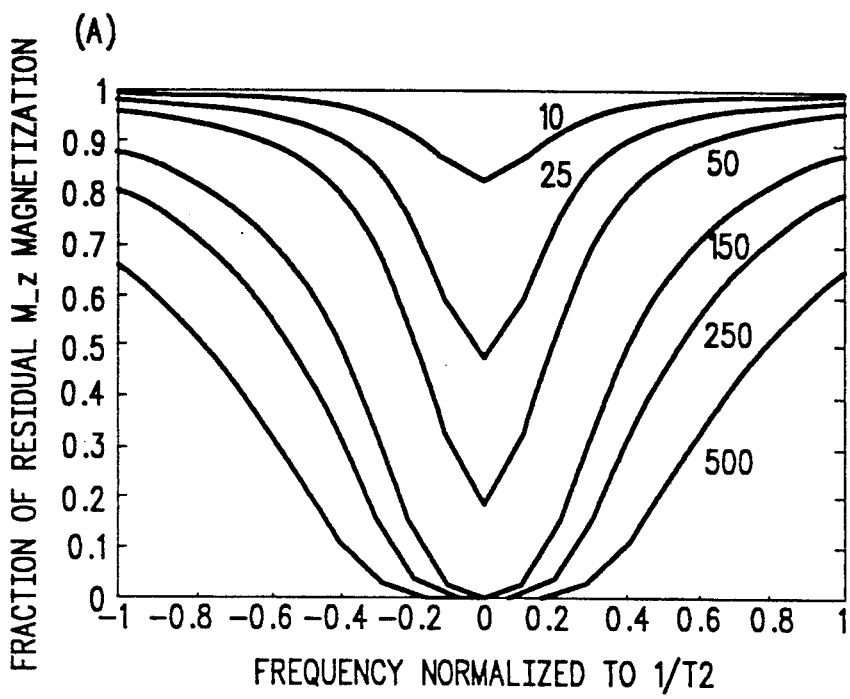
FIG. 4A and FIG. 4B are graphs illustrating the decay as a function of off resonance irradiation.
Figure 4B:
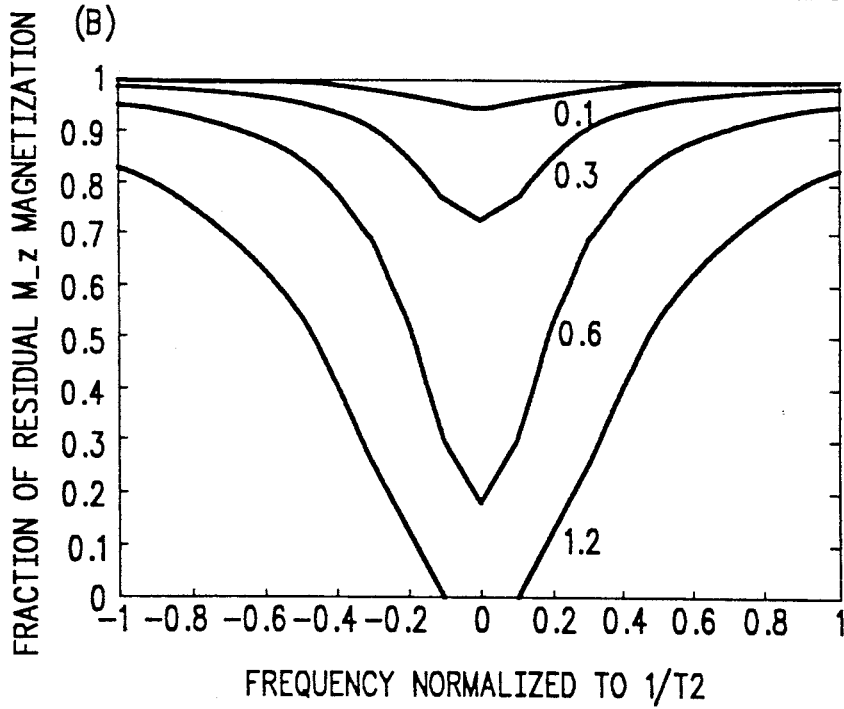

More importantly, the efficiency of the pulse is significantly affected when played off resonance. The tradeoff between duration and degree of off resonance of saturation pulses is plotted in FIG. 4A spectral response gives $\omega_1 = 1/10T_2$ and at time intervals ranging from 10-50T$_2$ is shown. As is apparent, the efficiency of the pulses is substantially reduced when played off resonance. Even irradiations at half a linewidth off resonance leads to substantial losses in efficiency. A comparison of the decay as a function of irradiation strength and off resonance frequency is plotted in FIG. 4B. Spectral response given irradiation duration of 4T$_2$ with $\omega_1$ ranging from $0.1-1.2 \times 1/T_2$.

A selective saturation pulse must have sufficient amplitude, and duration to allow for T$_2$ decay of the bound proton species but which otherwise results in a net zero degree angle of turn for the usual longer T$_2$ species. Further more, the pulse should be of minimal duration to avoid decay of the free proton species in the rotating frame and have sufficient bandwidth to prevent off resonance effects due to chemical shift and B$_0$ inhomogeneities.

In the short T$_2$ domain most of the current wealth of pulse design algorithms are not applicable as T$_2$ effects are generally ignored. The response to a selective excitation pulse with T$_2$ included can be computed numerically. However, we will first analyze the behavior of hard pulses to gain an intuitive understanding of this problem.

Figure 5:
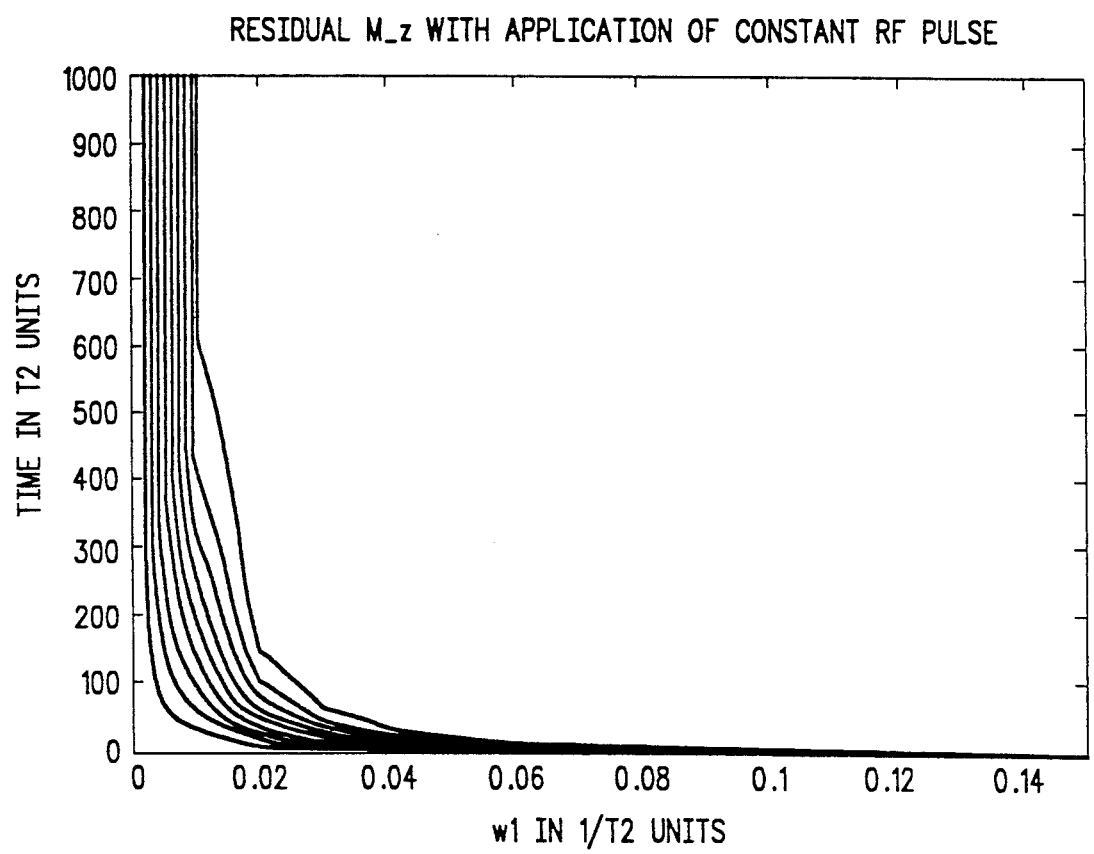
FIG. 5 is a graph illustrating the trade-off between $\omega_1$ strength and duration for various decay of a short $T_2$ species.

The primary requirement of the complete decay of the short T$_2$ species after a saturation RF pulse depends on the duration and amplitude of the RF pulse as seen in Eq. 1. While a longer duration of irradiation could theoretically compensate an inadequate RF strength, the penalty paid could be severe. A plot of the decay versus the irradiating field strength and duration is shown in FIG. 5. Illustrated is the tradeoff between $\omega_1$ strength and duration for various decay of the short T$_2$ species. Curves are derived from equation 1 with normalization of time and $\omega_1$ to T$_2$. Contour lines corresponds to 0.1 to 0.9 residual magnetization at equally spaced intervals. Insufficient RF amplitude is minimally compensated by increasing duration. As seen, an insufficient RF strength leads to minimal decay even over duration several hundred times that of the short T$_2$. Given an RF peak limit of $\sim 1$ KHz equivalent on a typical body imager, and T$_2$ of 40-100 us, a pulse duration of at least 1-2 ms is necessary for 90% decay.

Additional requirements of an adequate passband to preserve the usual observable proton peaks and minimization of the T$_2$ decay in the rotating frame of the free proton species require the use of a minimal duration pulse with a net zero degree tip angle.

A net zero degree pulse can be accomplished via several ways. Any $2\pi$ multiple pulse is theoretically a zero degree pulse. A simple hard pulse could thus achieve this goal. However, B$_1$ inhomogeneity remains a problem and must be overcome with potentially high SAR pulses. A true zero degree pulse, on the other hand is necessarily self correcting and highly immune to B$_1$ inhomogeneity. Furthermore, as implied in Eq. 1, beyond the point of critical damping, the decay of H$_r$ is also independent of B strength. True zero degree pulses, however, implies amplitude reversal within the pulse which may invalidate the assumption of $M_{xy} \approx 0$ at the beginning of each individual hard pulse used in deriving Eq. 1. Given the very short T$_2$ of H$_r$, however, M$_{xy}$ remains small and leads to frequency responses which correspond to intuition.

The simplest zero degree pulses are the binomial trains. These pulses are of minimal SAR due to their constant magnitude. The first in the series being the 1—$\bar{1}$ jump and return sequence which has a generally unfavorable spectral response. Higher order pulses in this series posses increasingly flatter passband characteristics. The frequency responses of the next order 1-$\bar{2}$-1 pulse for $T_2$ of 35 ms and 0.1 ms are simulated in FIG. 6. Note that the passband is approximately 500 Hz for a 2 ms pulse. The additional bandwidth is built in to allow for $B_0$ inhomogeneities and chemical shift. As expected, the long and short $T_2$ species exhibit vastly different behavior. Higher order pulses of similar duration and amplitude will yield better spectral behaviors.

Figure 6:
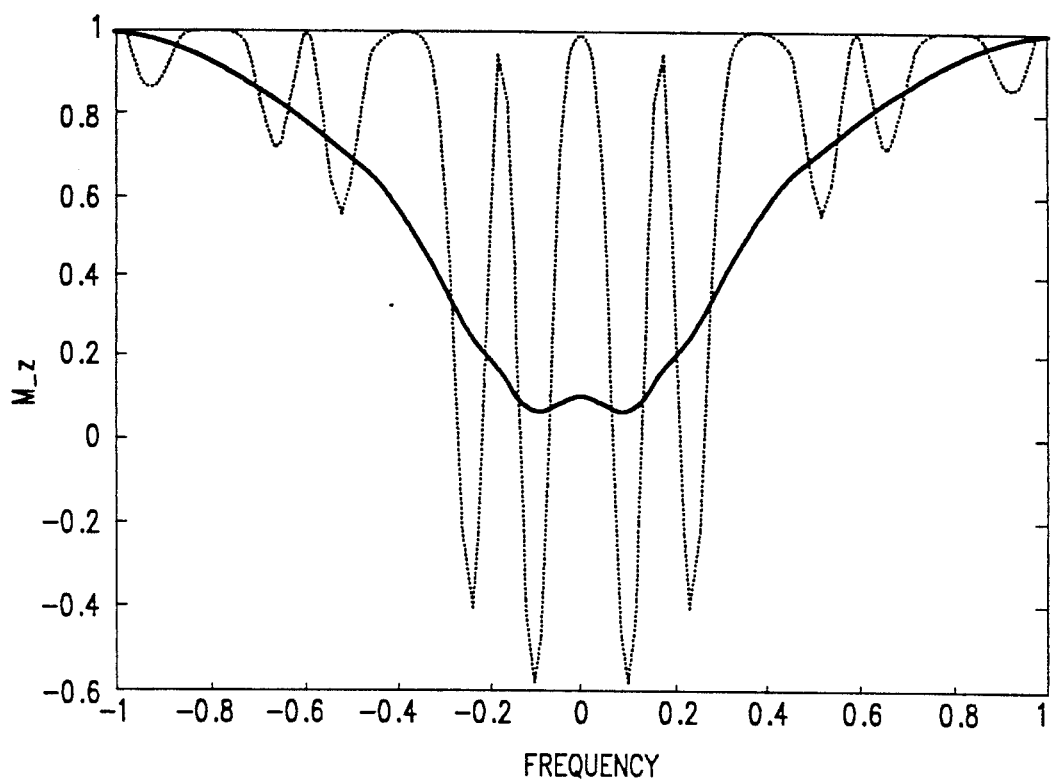
FIG. 6 is a graph illustrating spectral response of long $T_2$ species and short $T_2$ species to the application of a 1-$\bar{2}$-1 binomial pulse.
Figure 7:
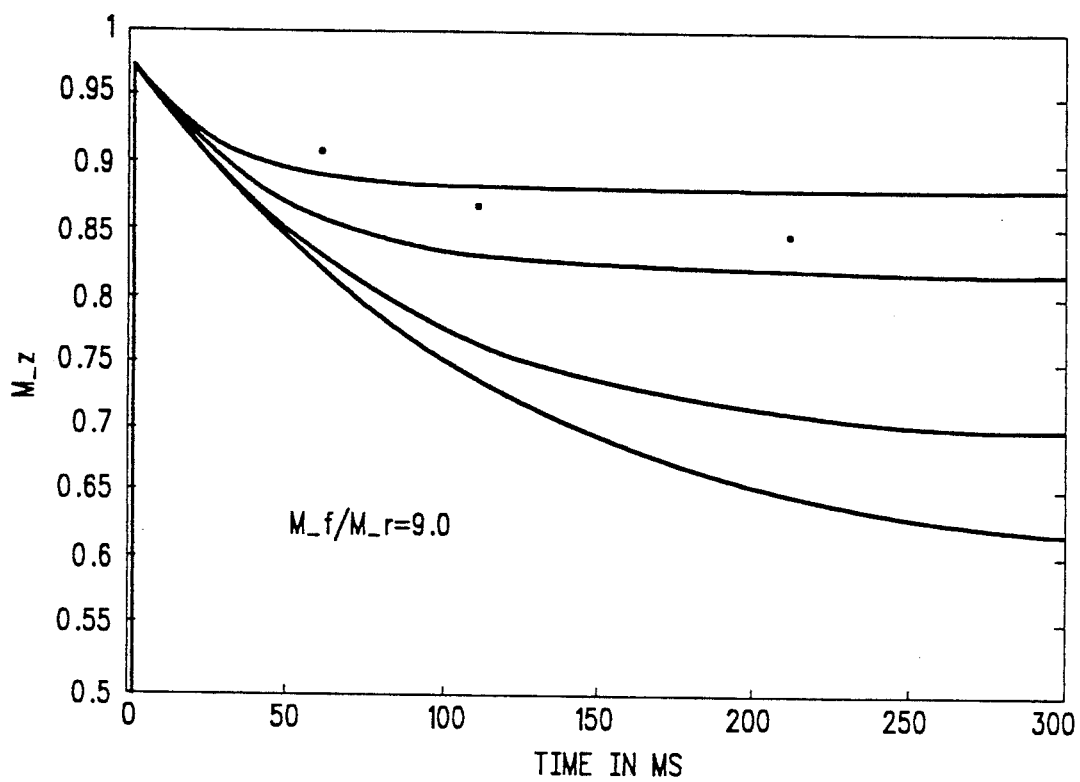
FIG. 7 is a plot illustrating time response of a long $T_2$ species after application of a saturation pulse.

As noted in FIG. 6, a single zero pulse is sufficient to saturate the short $T_2$ pool. Such a pulse allows the performance of a saturation recovery experiment. A series of timed readouts of the observable long $T_2$ species would then demonstrate the exchange mechanism at work. FIG. 7 shows the time response of the long $T_2$ after application of saturation pulse. The solid line is simulation data for $H_r$ to $H_f$ pool ratios of 1:1, 1:5, and 1:10 with an assumed $\tau_a$ of 300 ms. Equations 5 and 6 would then allow the determination of a number of parameters including the pool ratios and the exchange time constants.

Observation of the magnetization transfer effect can be accomplished by several ways including the subtraction of images as well as observation of contrast production after repeated application of the saturation pulse.

As seen from Eq. 5 any individual pulse would at maximum reduce $M_{zf}$ by the ratio $\tau_f/(\tau_f+\tau_r)$. This effect, in the absence of $T_1$ recovery, would accumulate geometrically with the application of additional pulses. Furthermore, the rate of decay is proportional to the absolute difference between $M_{zf}$ and $M_{zr}$ which is on the average largest when $M_{zr}$ is saturated frequently. This repeated saturation procedure was first described by Lurie and Slichter in detection of low abundance $Li_6$ via cross relaxation with $Li_r$ Citation 13.

Frequent pulse applications will generate the larger pool differences in the average; therefore, ensure the fastest decay of the observable proton pools. Lengthening the interpulse duration, however, allows for more complete saturation exchange until the spin lattice relaxation effects causes all magnetization to increase.

EXPERIMENTAL RESULTS

Figure 8:
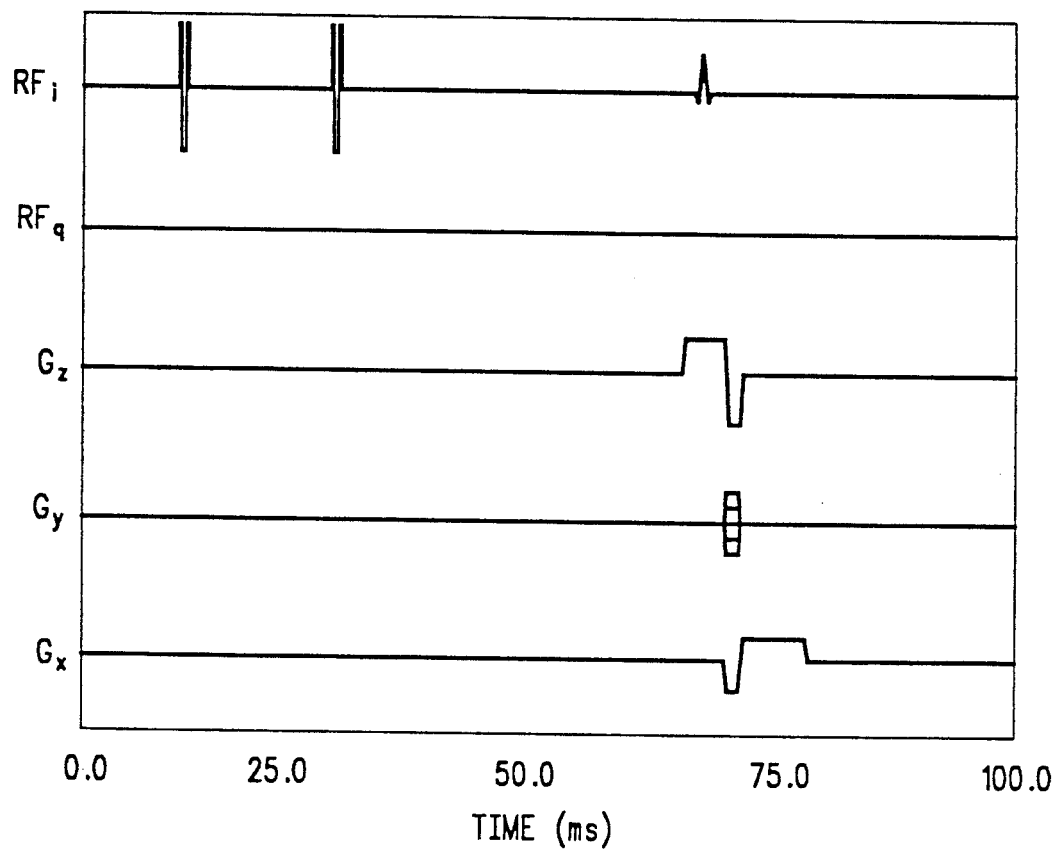
FIG. 8 illustrates the RF signals and magnetic gradients for basic saturation transfer sequence in slice selective imaging.

The pulse sequence shown in FIG. 8 was implemented and tested on an 1.5 T GE Signa system with shielded gradients. This i a basic saturation transfer sequence for slice selective imaging. The sequence includes the application of a variable number of 1-2-1 binomial RFi (in phase) saturation pulses initially followed by a generic gradient recalled slice select imaging sequence. Echo time is kept short to minimize $T_2$ related contrast. The number of saturation pulses of 1 ms duration individually varies between 1 to 10 for the below experiments. Unless otherwise stated, the images are acquired with gradient recall sequences ($C_{7x}$, $C_{7x}$, $C_{7z}$) using a compact gradient readout with an echo time of 3.8 ms.

Figure 9A:
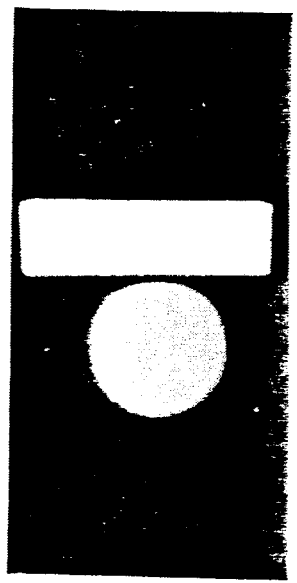
FIG. 9A and FIG. 9B are photographs illustrating phantom experiments in assessing the degree of saturation of longer $T_2$ species due to rotating frame decay.
Figure 9B:
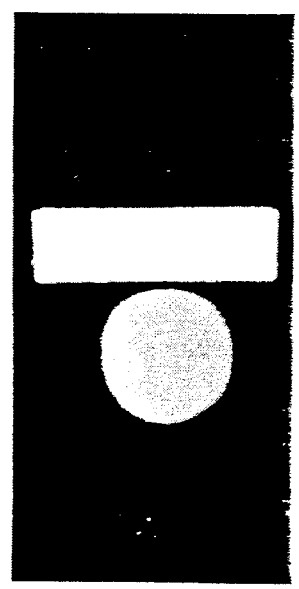

As the zero degree pulses are of finite duration, some decay of the longer $T_2$ pool is also expected after each pulse. To aid in the interpretation of the images, the effects of such pulses on fat and doped water phantoms without exchange are studied in Experiment 1. The images in FIGS. 9A and 9B were obtained with and without the application of 10 saturation pulses at a repetition time of 38 ms. The square phantom contained water doped with manganese chloride to $T_2$ of 78 ms, and the round phantom contained Wesson oil with a measured $T_2$ of 40 ms. FIG. 9A as the generic gradient echo recalled imaging sequence without saturation pulses with a TE of 3.8 ms and TR of 3 s. FIG. 9B used saturation pulses applied 10 times with interpulse delays of 38 ms prior to imaging. Both oil and water signals decreased by less than 5%. Imaging sequence TR was 3000 ms to minimize $T_1$ effects. The images demonstrate signal reduction of ~4% in the absence of exchange. While the change in degree of contrast is virtually undetectable, the presence of even mild signal reduction suggests caution in interpreting minimal changes in image intensity using this technique.

To estimate the size of the short $T_2$ pool and to demonstrate the exchange process directly, the time behavior of $M_{zf}$ is examined after a single saturation pulse. FIG. 7 demonstrates the time evolution of $M_z$ of muscle after such a pulse. Each point is generated with a separate experiment increasing in time between the saturation and readout pulses. The small continued decrease in the longitudinal magnetization during the RF free interval directly demonstrates the effect of saturation transfer from the unobservable short $T_2$ pool. The magnitude of the effect is small suggesting a relatively small short $T_2$ pool size of about 5–10%. The rate of decay can be calculated using equation 3 giving a $\tau_f$ of about 500 ms and a $\tau_r$ of about 50 ms. Given the relatively small short $T_2$ pool, dynamic range and the rate of exchange become practical issued which limited the applicability of this technique in measuring tissue parameter in vivo.

Figure 10A:
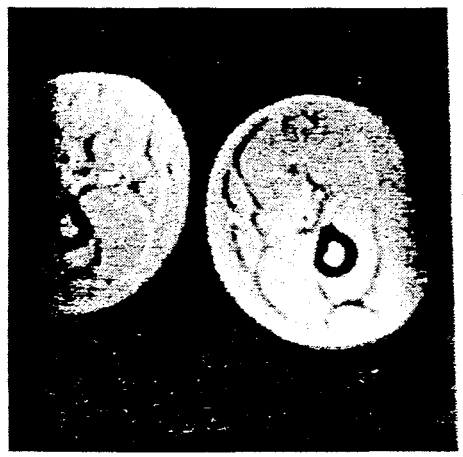
FIGS. 10A-10D are in vivo images produced with 10 saturation transfer pulses.
Figure 10B:
Figure 10C:
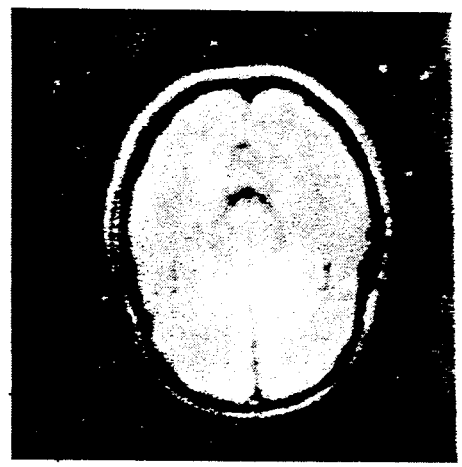
Figure 10D:
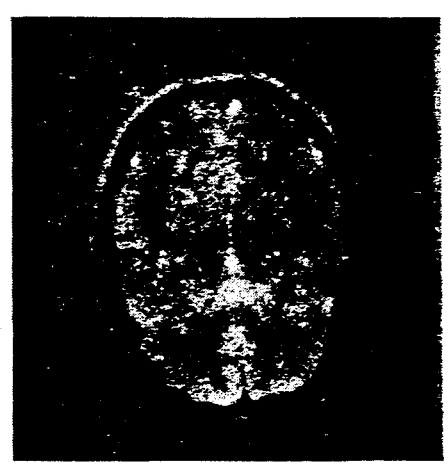

FIGS. 10A–10D demonstrate saturation contrast using pulse trains in the legs, and brain of a normal volunteer. FIGS. 10A and 10B are cross-sectional slices through the leg of a normal human volunteer with and without 10 saturation pulses. Significant contrast developed between muscle and fat. Blood is bright through a combination of inflow effects and relative lack of saturation transfer. FIGS. 10C and 10D are an axial slice through the head of a normal human volunteer with and without 10 saturation pulses. Note the reduction of muscle signal in the scalp, the contrast development between white and grey matter as well as the preservation of CSF signal due to absence of magnetization exchange in this fluid. In these images an inverse $T_1$ like contrast is seen. Consistent with the simulation analysis, the maximal SAR of this sequence is about 7 watts/kg with an average SAR of about 0.6 watts/kg over a TR.

SUMMARY

We have shown that in accordance with the invention pulse methods can be applied to the demonstration of saturation transfer. Importantly, pulse techniques performed on resonance is theoretically a more power efficient saturation method than off-resonance continuous wave irradiation. Further more, such pulses can be easily implemented on conventional imagers. The pulse technique as implemented shares the drawback with off resonance irradiation of unavoidably affecting the longer $T_2$ species though it is seen that this effect is fortunately small (~5%) for many tissues which have relatively long $T_2$. Saturation transfer induced image contrast can be produced from selective saturation of short $T_2$ species with extremely short, intense on-resonance pulses. Theory and experiments agree will with current theories underlying these phenomenons.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of detecting NMR signals indicative of a short $T_2$ species in the presence of a long $T_2$ species utilizing magnetization transfer between species comprising the steps of
   a) positioning a body including said short $T_2$ species and said long $T_2$ species in a static magnetic field ($B_0$),
   b) applying at least one zero degree RF pulse to said body at a resonance frequency for said short $T_2$ species and said long $T_2$ species, said RF pulse providing selective magnetization saturation of said short $T_2$ species, and said RF pulse being spaced in time from detection to allow magnetization transfer from said short $T_2$ species to said long $T_2$ species, and
   c) detecting signals from said long $T_2$ species in response to magnetization transfer from said short $T_2$ species to said long $T_2$ species.

2. The method as defined by claim 1 wherein step b) includes applying pulses with each pulse having a magnitude and a duration sufficient for significant magnetization decay in the short $T_2$ species.

3. The method as defined by claim 2 wherein step b) includes applying binomial pulses.

4. The method as defined by claim 3 wherein said binomial pulses are 1-$\bar{2}$-1 pulses.

5. The method as defined by claim 2 wherein step b) includes applying zero degree adiabatic pulses.

6. The method as defined by claim 1 and further including after step b) the step of applying gradients to said body for signal localization.

7. In the detection of NMR signals utilizing magnetization transfer between a short $T_2$ species and a long $T_2$ species, the method of magnetically exciting the short $T_2$ species without exciting the long $T_2$ species comprising the steps of
   positioning a body including said short $T_2$ species and said long $T_2$ species in a static magnetic field ($B_0$), and applying a sequence of zero degree RF pulses to said body at a resonance frequency for said short $T_2$ species and said long $T_2$ species, said RF pulses providing selective magnetization saturation of said short $T_2$ species, and said RF pulses being spaced in time to allow magnetization transfer from said short $T_2$ species to said long $T_2$ species.

8. The method as defined by claim 7 wherein each of said pulses has a magnitude and a duration sufficient for significant magnetization decay in the short $T_2$ species.

9. Apparatus for detecting NMR signals indicative of a short $T_2$ species in the presence of a long $T_2$ species comprising
   means for establishing a static magnetic field ($B_0$),
   means for applying a sequence of zero degree RF pulses at a resonance frequency for said short $T_2$ species and said long $T_2$ species, said RF pulses providing selective magnetization saturation of said short $T_2$ species, and RF pulses being spaced in time to allow magnetization transfer from said short $T_2$ species to said long $T_2$ species, and
   means for detecting signals from said long $T_2$ species in response to magnetization transfer from said short $T_2$ species to said long $T_2$ species.

10. The apparatus as defined by claim 9 wherein said means for applying a sequence of zero degree RF pulses applies pulses having a magnitude and a duration sufficient for significant magnetization decay in the short $T_2$ species.

11. The apparatus as defined by claim 10 wherein said means for applying pulses applies binomial pulses.

12. The apparatus as defined by claim 10 wherein said means for applying pulses applies zero degree adiabatic pulses.

13. The apparatus as defined by claim 9 and further including means for applying gradients for signal localization.

* * * * *